(12) United States Patent
Wu et al.

(10) Patent No.: US 11,844,187 B2
(45) Date of Patent: Dec. 12, 2023

(54) CABLE MANAGEMENT DEVICE WITH VARIABLE TOTAL LENGTH AND SERVER CHASSIS HAVING THE SAME

(71) Applicant: Fulian Precision Electronics (Tianjin) Co., LTD., Tianjin (CN)

(72) Inventors: Chang-Ju Wu, New Taipei (TW); Chen-Sheng Tang, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/749,314

(22) Filed: May 20, 2022

(65) Prior Publication Data

US 2023/0026480 A1 Jan. 26, 2023

(30) Foreign Application Priority Data

Jul. 21, 2021 (CN) .......................... 202110824403.8

(51) Int. Cl.
*H05K 7/14* (2006.01)

(52) U.S. Cl.
CPC ......... *H05K 7/1491* (2013.01); *H05K 7/1489* (2013.01)

(58) Field of Classification Search
None
See application file for complete search history.

(56) References Cited

U.S. PATENT DOCUMENTS

| 10,182,511 | B1 * | 1/2019 | Chen | .......................... H05K 7/18 |
| 2009/0078834 | A1 * | 3/2009 | Chen | .................... H01R 9/2416 248/70 |
| 2016/0238159 | A1 * | 8/2016 | Chang | .................. H05K 7/1491 |

* cited by examiner

*Primary Examiner* — James Wu
*Assistant Examiner* — Christopher L Augustin
(74) *Attorney, Agent, or Firm* — ScienBiziP, P.C.

(57) ABSTRACT

A cable management device in a server chassis able to hold and safeguard a greatly extended range of cable lengths, and server chassis including same, comprises connecting assembly, sliding rail assembly, and cable management assembly. The sliding rail assembly includes parallel first and second sliding rails, the first sliding rail including outer, middle, and inner rails, and the second sliding rail including similar outer, middle, and inner rails. The assembly includes first to fourth sliding arms, together with a supporting bar. The first sliding arm is movably connected to the outer rail of the second sliding rail, and the fourth sliding arm is movably connected to the inner rail of the first sliding rail. One end of the supporting bar is connected to the middle rail of the first sliding rail, the other end is connected to the middle rail of the second sliding rail.

18 Claims, 9 Drawing Sheets

CABLE MANAGEMENT DEVICE WITH VARIABLE TOTAL LENGTH AND SERVER CHASSIS HAVING THE SAME

FIELD

The subject matter herein generally relates to electronic equipment, and more particularly, to a cable management device and a server chassis having the device.

BACKGROUND

A server chassis usually includes a cabinet and at least one server installed in the cabinet. During data migration or routine maintenance, the server needs to be exposed and made accessible by being pulled out of the cabinet. After such data migration or routine maintenance is finished, the server needs to be pushed back into the cabinet.

The server chassis has a cable management device to support and manage different cables of the server, to ensure that the cables do not become entangled, and are not pinched or overstretched during server movement. The cable management device becomes effectively longer during the pulling process and shorter during the retraction process. However, if a server chassis is made longer to accommodate more cables or servers, the distance range or potential distance range of the existing cable management device will not meet actual needs.

BRIEF DESCRIPTION OF THE DRAWINGS

Implementations of the present disclosure will now be described, by way of embodiments only, with reference to the attached figures.

DETAILED DESCRIPTION

Some embodiments of the present application will be described in detail below with reference to the drawings. The following embodiments and features of the embodiments may be combined with each other in the absence of conflict.

It should be noted that when a component is said to be "mounted" on another component, it may be directly on another component or it may exist in an intermediate component. When a component is said to be "set on" another component, it can be set directly on another component or it may coexist with an intermediate component.

Unless otherwise defined, all technical and scientific terms used herein have the same meaning as commonly understood by persons skill in the art. The terms used herein are only for the purpose of describing specific embodiments, and not intended to limit the embodiments of the present application.

Figure 1:
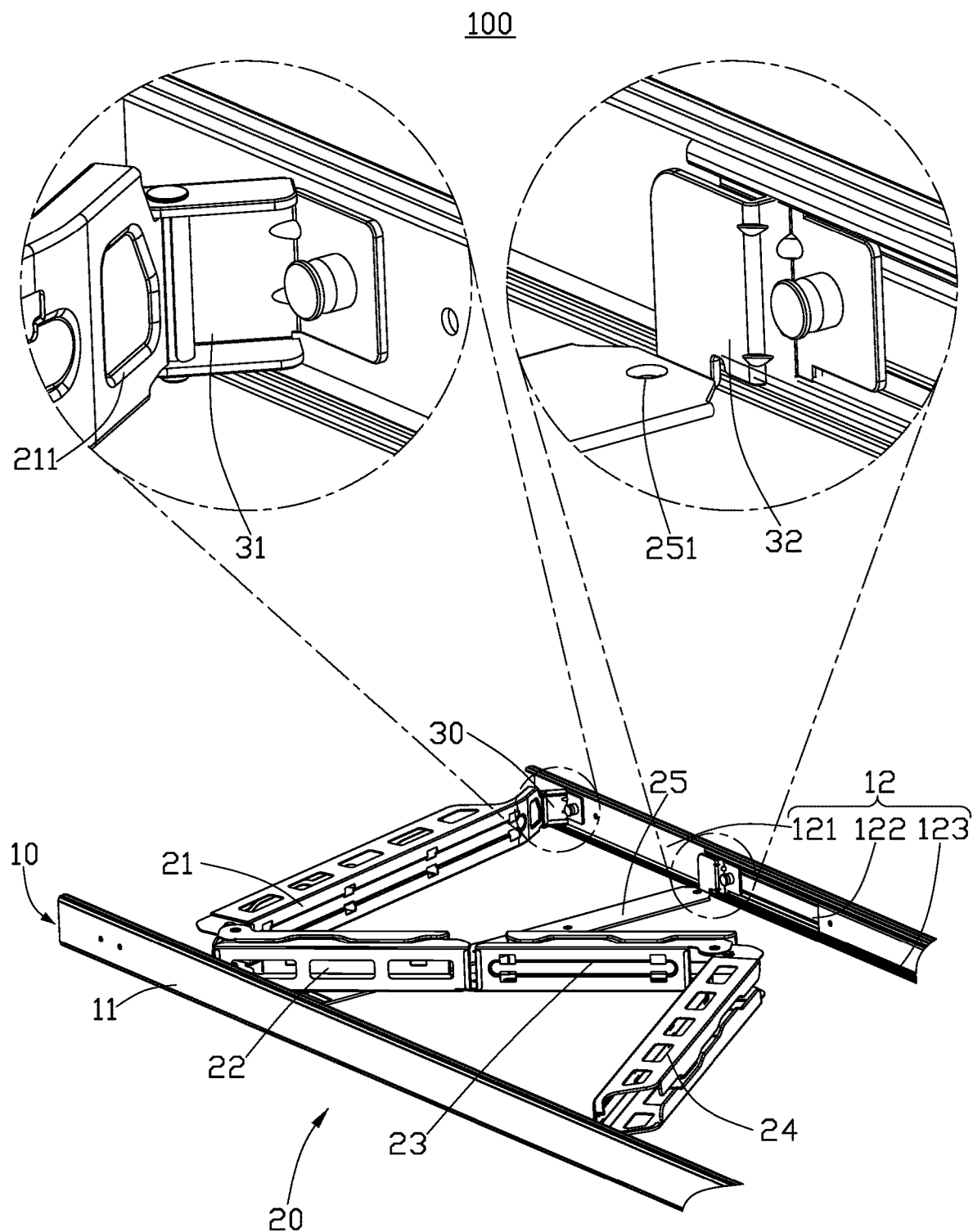
FIG. 1 is a diagrammatic view of a cable management device according to an embodiment of the present disclosure.

Referring to FIG. 1, a cable management device 100 is provided according to an embodiment of the present disclosure. The cable management device 100 includes a sliding rail assembly 10, a cable management assembly 20, and a connecting assembly 30. The cable management assembly 20 is slidably arranged on the sliding rail assembly 10 through the connecting assembly 30. The cable management assembly 20 is configured for supporting and managing cables (not shown) connected to an external device.

Figure 2:
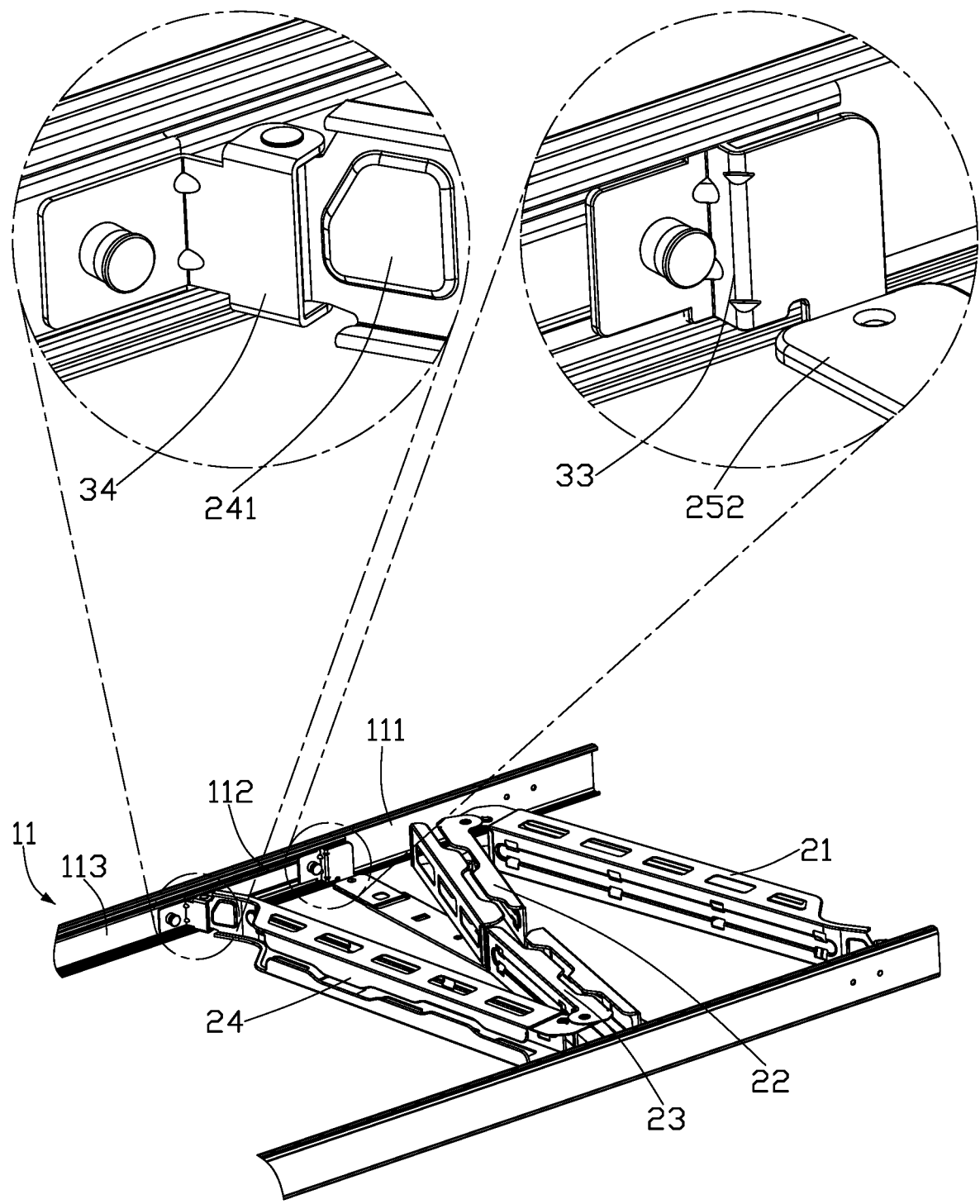
FIG. 2 is similar to FIG. 1, but showing the cable management device from another angle.

Referring to FIGS. 1 and 2, the sliding rail assembly 10 includes a first sliding rail 11 and a second sliding rail 12. The first sliding rail 11 and the second sliding rail 12 are parallel to each other. The first sliding rail 11 includes a first outer rail 111, a first middle rail 112, and a first inner rail 113. The first middle rail 112 is slidably arranged on the first outer rail 111, and the first inner rail 113 is slidably arranged on the first middle rail 112. The second sliding rail 12 includes a second outer rail 121, a second middle rail 122, and a second inner rail 123. The second middle rail 122 is slidably arranged on the second outer rail 121, and the second inner rail 123 is slidably arranged on the second middle rail 122.

Figure 3:
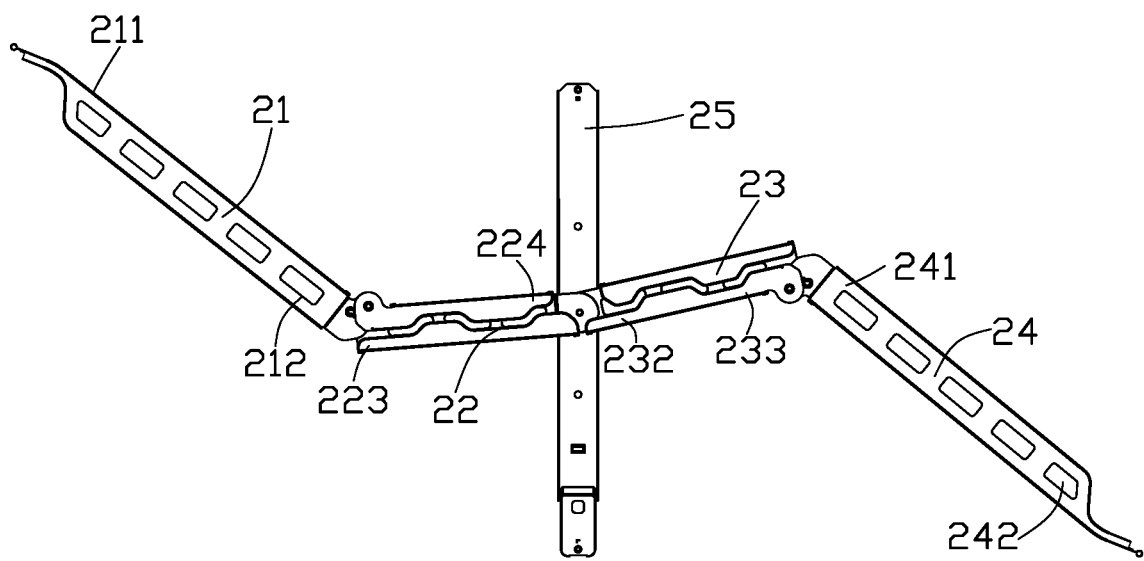
FIG. 3 is a top view of a cable management assembly of the cable management device of FIG. 1.

Referring to FIGS. 1 to 3, the cable management assembly 20 includes a first sliding arm 21, a second sliding arm 22, a third sliding arm 23, a fourth sliding arm 24, and a supporting bar 25. The first to fourth sliding arms 21-24 are pivotally connected in that order for accommodating the cables. In an embodiment, each of the first to fourth sliding arms 21-24 has at least one cable receiving cavity (not shown in the drawings) for receiving the cables. The supporting bar 25 is rotatably connected to a pivot joint of the second sliding arm 22 and the third sliding arm 23. The first sliding arm 21 includes a first end portion 211 and a second end portion 212 opposite to the first end portion 211. The second sliding arm 22 includes a third end portion 223 and a fourth end portion 224 opposite to the third end portion 223. The third sliding arm 23 includes a fifth end portion 232 and a sixth end portion 233 opposite to the fifth end portion 232. The fourth sliding arm 24 includes a seventh end portion 241 and an eighth end portion 242 opposite to the seventh end portion 241. The first end portion 211 is pivotally connected to the second outer rail 121 through the connecting assembly 30. The second end portion 212 and the third end portion 223 of the second sliding arm 22 are pivotally connected to each other. The fifth end portion 232 of the third sliding arm 23 is pivotally connected to the fourth end portion 224 of the second sliding arm 22. The sixth end portion 233 of the third sliding arm 23 is pivotally connected to the seventh end portion 241 of the fourth sliding arm 24. The eighth end portion 242 is slidably connected to the first inner rail 113 through the connecting member 30.

Figure 4:
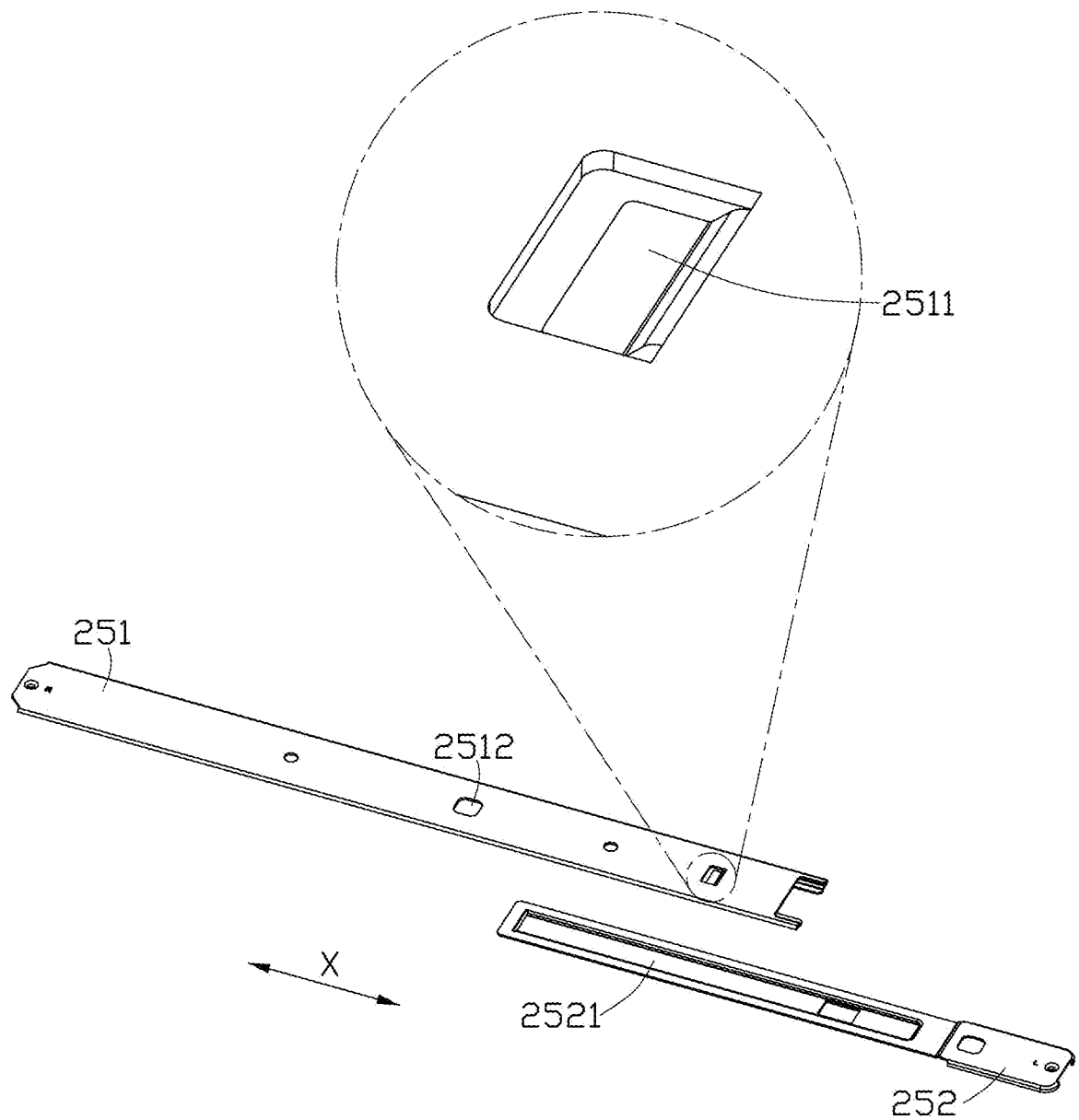
FIG. 4 is an exploded view of a supporting bar of the cable management assembly of FIG. 3.

Referring to FIG. 4, the supporting bar 25 includes a first sliding member 251 and a second sliding member 252 slidably arranged on the first sliding member 251. The first sliding member 251 is slidably sleeved on the second sliding member 252 in a length direction X of the supporting bar 25.

One end of the first sliding member 251 is movably mounted on the second middle rail 122 through the connecting assembly 30, and the other end is slidably sleeved on the second sliding member 252. One end of the second sliding member 252 away from the first sliding member 251 is movably mounted on the first middle rail 112 through the connecting assembly 30.

In one embodiment, the first sliding member 251 is provided with a clamping part 2511, which protrudes from a surface of the first sliding member 251 facing the second sliding member 252. The clamping part 2511 clamps onto the second sliding member 252, thereby restricting the movement of the second sliding member 252. In one embodiment, the second sliding member 252 defines a groove 2521, and the clamping part 2511 is slidably received in the groove 2521. The groove 2521 works to limit the movement of the clamping part 2511, preventing separation or displacement during sliding of the first sliding member 251 and the second sliding member 252. The first sliding member 251 also defines a pivot hole 2512, which is connected to the pivot joint of the second sliding arm 22 and the third sliding arm 23.

The lengths and shapes of the first sliding member 251 and the second sliding member 252 can be designed according to actual requirements, which are not limited herein.

Figure 5:
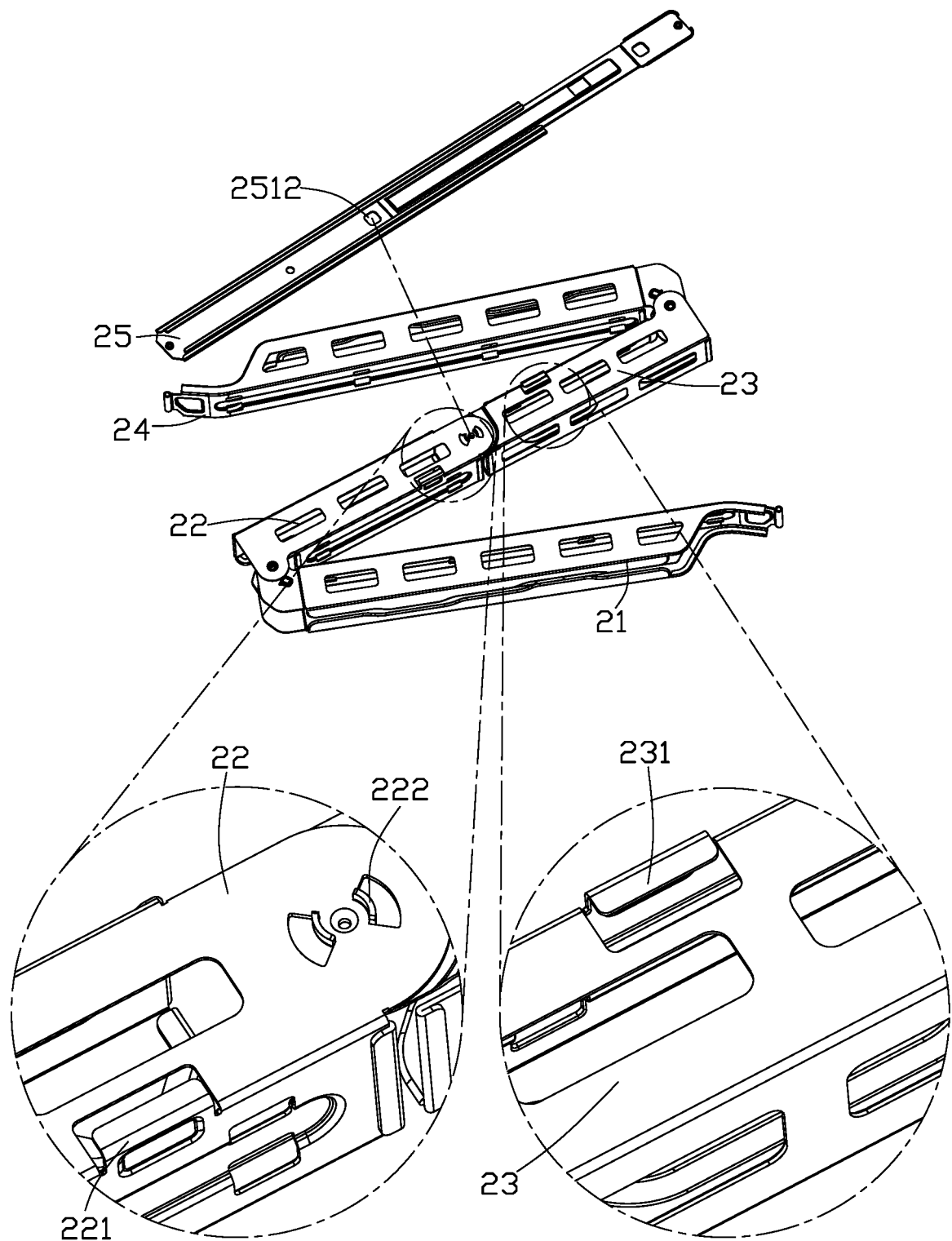
FIG. 5 is a diagrammatic view of a cable management assembly of the cable management device of FIG. 1.
Figure 6:
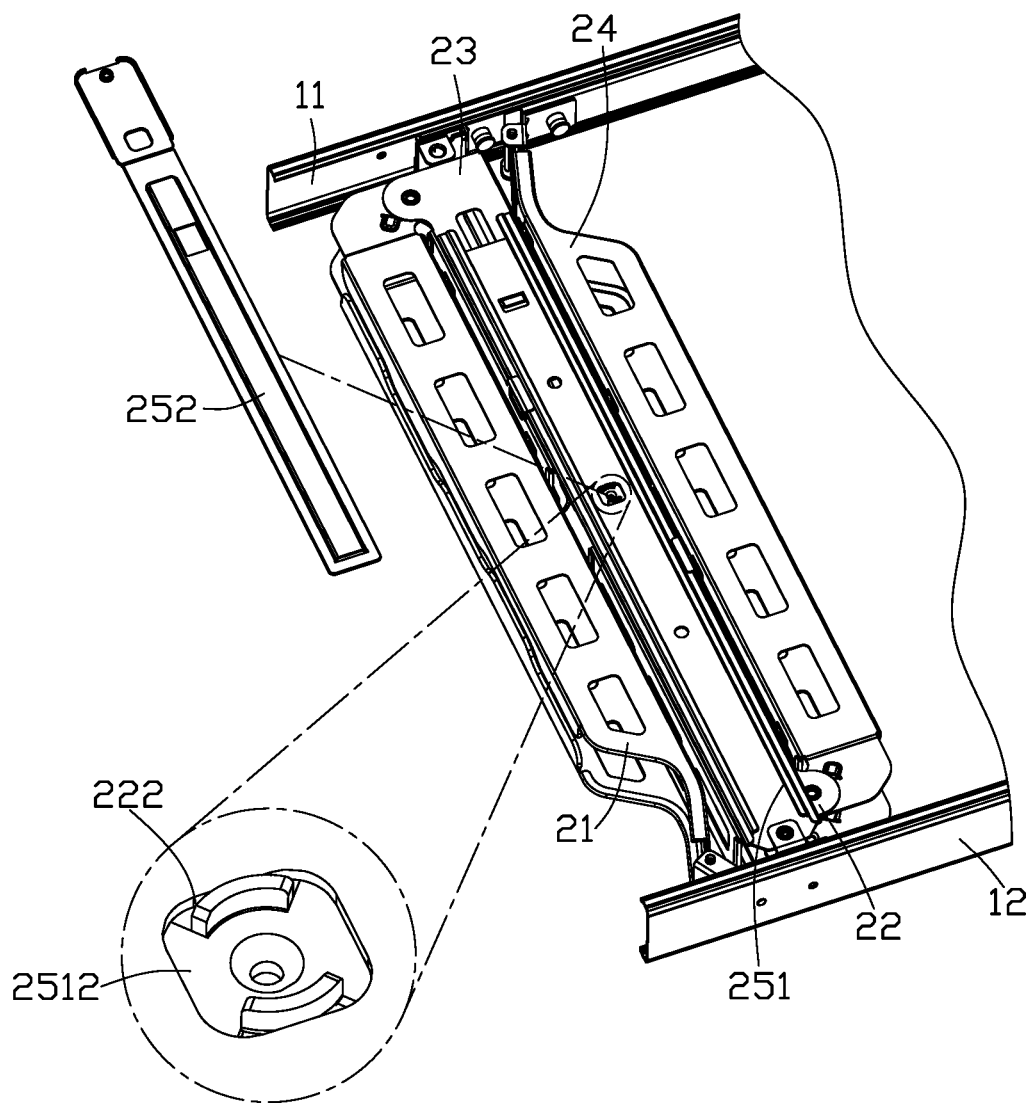
FIG. 6 is similar to FIG. 5, but showing the cable management device in a folded state.

Referring to FIGS. 5 and 6, in one embodiment, the second sliding arm 22 further includes a first bent portion 221, and the first bent portion 221 is disposed towards the fourth sliding arm 24 to limit the movement of one side of the supporting bar 25. The third sliding arm 23 further includes a second bent portion 231, and the second bent portion 231 is disposed towards the first sliding arm 21 to limit the movement of the other side of the supporting bar 25. The second sliding arm 22 is also provided with at least one first protrusion 222. The at least one first protrusion 222 cooperates with the pivot hole 2512, so that the first sliding member 251 can move together with but cannot disengage from the second sliding arm 22. In one embodiment, the number of first protrusions 222 is two, and the two first protrusions 222 are arranged symmetrically. When the supporting bar 25 is connected to the pivot joint of the second sliding arm 22 and the third sliding arm 23, the pivot hole 2512 provided on the first sliding member 251 is sleeved on the first protrusion 222. One side of the first sliding member 251 is clamped to the second sliding arm 22 under the restriction of the first bent portion 221, and the other side of the first sliding member 251 is clamped to the third sliding arm 23 under the restriction of the second bent portion 231. The second sliding member 252 is slidably connected to the first sliding member 251. In one embodiment, the pivot hole 2512 is generally square, and the two first protrusions 222 generally describe a circle. The side length of the pivot hole 2512 is greater than the maximum diameter of the circle formed by the two first protrusions 222, so that the two first protrusions 222 can move in the pivot hole 2512, and will not disengage from the pivot hole 2512 under the restriction of a fitting piece 26. The connection between the first sliding member 251 and the second sliding arm 22 and the third sliding arm 23 has a higher degree of freedom, so that the cable management assembly 20 can be folded and unfolded more smoothly. The shapes of the first protrusion 222 and the pivot hole 2512 can be changed, as long as the first sliding member 251 is inseparable from the second sliding arm 22 under the function of the first protrusion 222, not limited herein. In one embodiment, the first bent portion 221 is in an "L" shape, and the second bent portion 231 is in an "L" shape.

Figure 7:
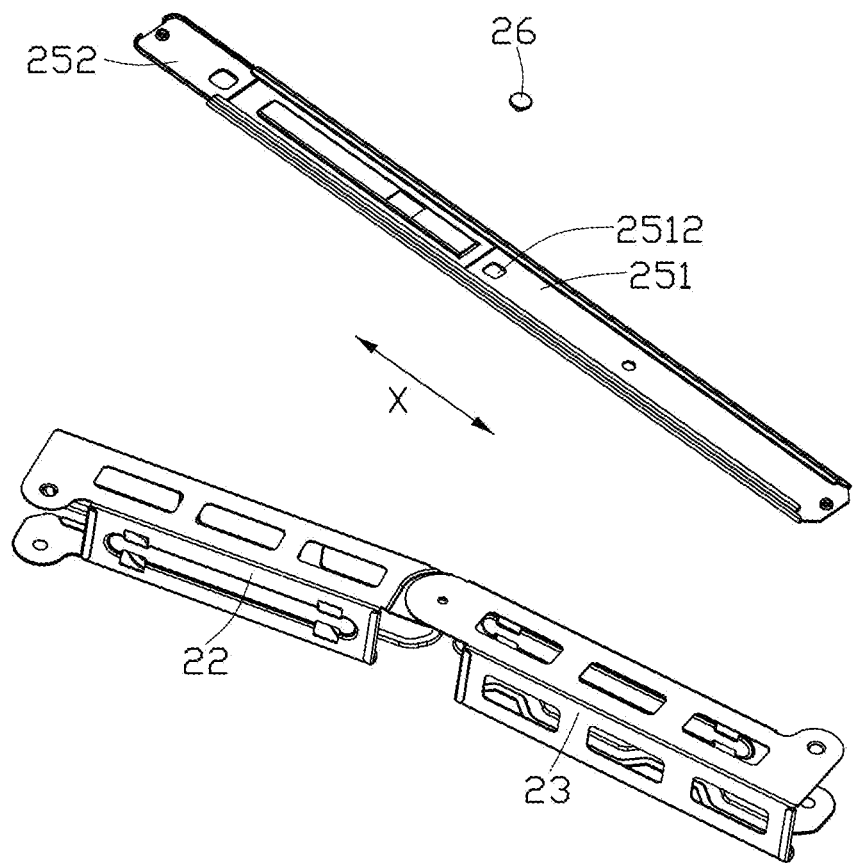
FIG. 7 is an exploded view of a part of the cable management assembly of FIG. 6.

Referring to FIG. 7, in other embodiments, the pivot hole 2512 provided on the first sliding member 251 is used to install the fitting piece 26. The fitting piece 26 penetrates through the pivot hole 2512 and the pivot of the second sliding arm 22 and the third sliding arm 23, so that the first sliding member 251 is rotatably connected to the pivot joint of the second sliding arm 22 and the third sliding arm 23.

Referring to FIG. 6, when the cable management assembly 20 is in the folded state, the second sliding arm 22 and the third sliding arm 23 are in a straight line, and each of the second sliding arm 22 and the third sliding arm 23 substantially overlaps with the supporting bar 25. The supporting bar 25 is used to carry the second sliding arm 22 and the third sliding arm 23. When the cable management assembly 20 is lifted or pulled by an external force, the first sliding member 251 and the second sliding member 252 move along the first middle rail 112 and the second middle rail 122. When the second sliding arm 22 and the third sliding arm 23 are unfolded, the gap between the second sliding arm 22 and the third sliding arm 23 is filled by the displacement of the first sliding member 251, so as to achieve precise movement of the second sliding arm 22 and the third sliding arm 23

Referring to FIGS. 1 and 2, the connecting assembly 30 includes a first connecting member 31, a second connecting member 32, a third connecting member 33, and a fourth connecting member 34. The first to fourth connecting members 31-34 are all disposed on the sliding rail assembly 10. Specifically, one end of the first connecting member 31 is connected to the second outer rail 121, and the other end is pivotally connected to the first sliding arm 21, so that one end of the first sliding arm 21 away from the second sliding arm 22 rotates relative to the first connecting piece 31. One end of the second connecting member 32 is connected to the first sliding member 251, and the other end is connected to the second middle rail 122, so that the second middle rail 122 drives the first sliding member 251 to move when the second middle rail 122 slides.

One end of the third connecting member 33 is connected to the second sliding member 252, and the other end is connected to the first middle rail 112, so that when sliding the first middle rail 112 drives the second sliding member 252 to move. One end of the fourth connecting member 34 is connected to the first inner rail 113, and the other end is pivotally connected to the fourth sliding arm 24, so that one end of the fourth sliding arm 24 away from the third sliding arm 23 rotates relative to the fourth connecting member 34, and when sliding the inner rail 113 drives the fourth sliding arm 24 to move.

Figure 8A:
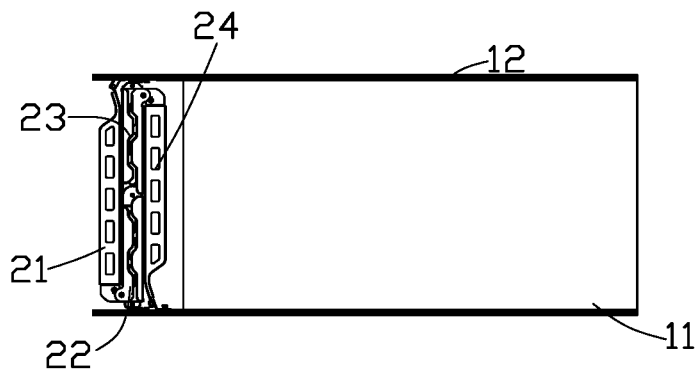
FIG. 8A is a top view of the cable management device of FIG. 1 in a different state.
Figure 8B:
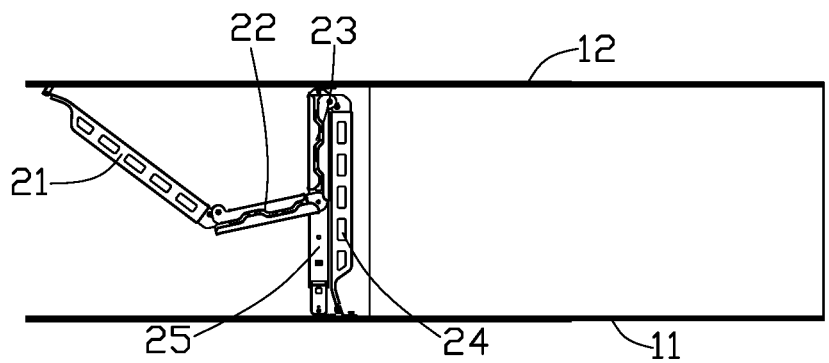
FIG. 8B is a top view of the cable management device of FIG. 1 in another state.
Figure 8C:
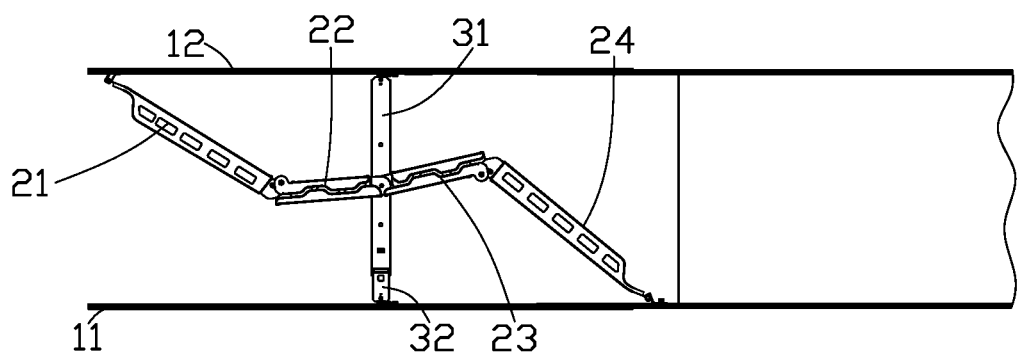
FIG. 8C is a top view of the cable management device of FIG. 1 in yet another state.

FIG. 8A shows that the cable management device 100 is in the folded state. Referring to FIGS. 8B and 8C, when the cable management device 100 is lifted or pulled, the first to fourth sliding arms 21-24 gradually unfold with respect to each other. The first sliding member 251 and the second sliding member 252 move synchronously with the first middle rail 112 and the second middle rail 122. The first sliding arm 21 is the first to extend under the pulling force, then the second sliding arm 22 extends, then the third sliding arm 23 extends, and finally the fourth sliding arm 24 extends. When the cable management device 100 is pushed into retraction, the movements are in reverse.

Figure 9:
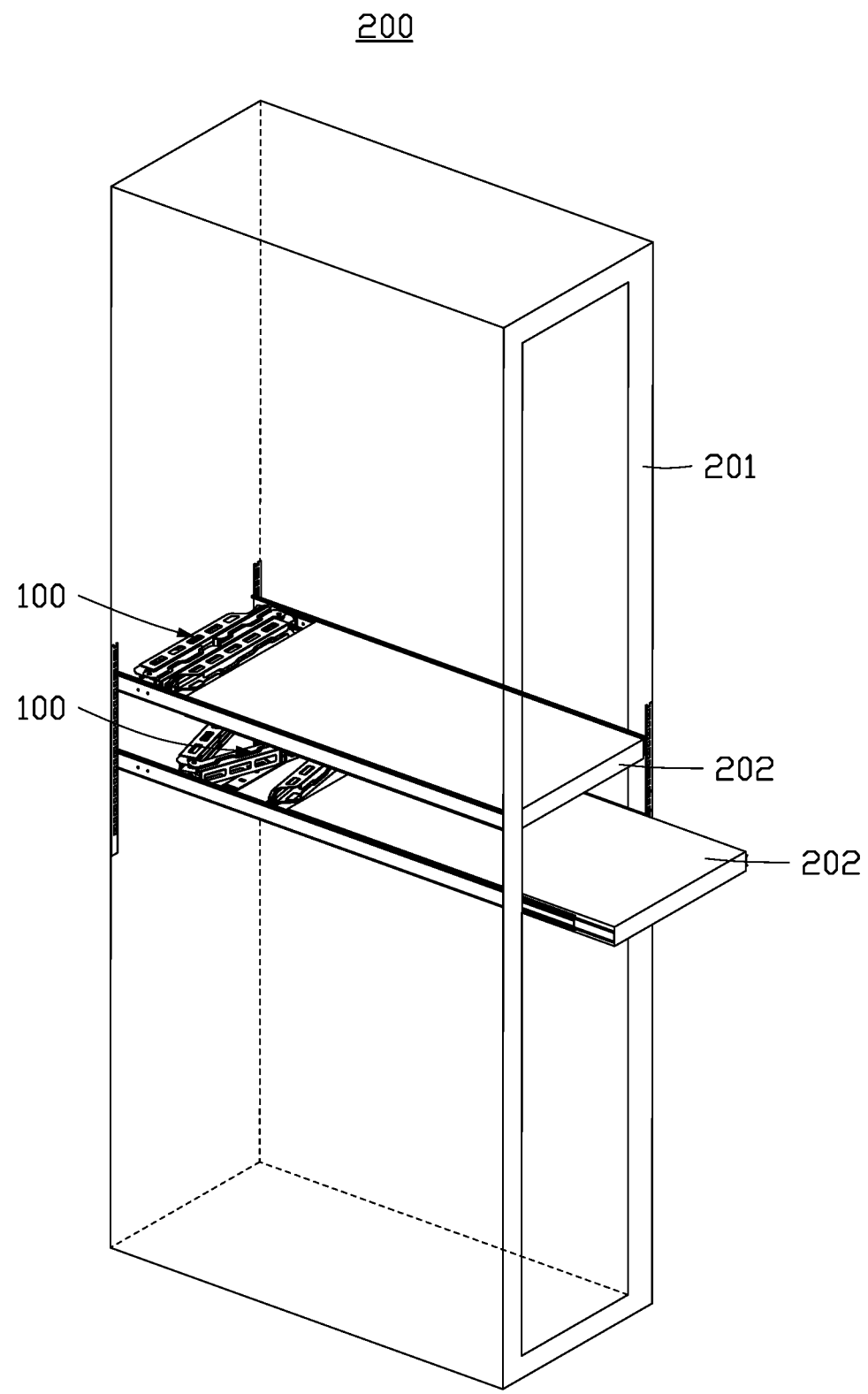
FIG. 9 is a top view of a server chassis according to an embodiment of the present disclosure.

Referring to FIG. 9, the present application also provides a server chassis 200. The server chassis 200 includes a cabinet 201, at least one carrier board 202, and at least one of the above-mentioned cable management devices 100. The sliding rail assembly 10 of the cable management device 100 is installed on the cabinet 201. The carrier board 202 is configured for supporting a server (not shown), and each of the cables of the server can be accommodated in the first to fourth sliding arms 21-24 of the cable management device 100. The carrier board 202 is slidably connected to the sliding rail assembly 10 of the cable management device 100. In the above-mentioned cable management device 100, the first sliding arm 21, the second sliding arm 22, the third sliding arm 23, the fourth sliding arm 24 are pivotally connected together, and the first sliding arm 21, the fourth sliding arm 24, and the supporting bar 25 are disposed on corresponding rails of the sliding rail assembly 10. As such, the maximum length of the cable management device 100 is greatly enlargable to meet actual needs.

The above descriptions are some specific embodiments of the present application, but the actual application process cannot be limited only to these embodiments. For those of ordinary skill in the art, other modifications and changes made according to the technical concept of the present application should all belong to the protection scope of the present application.

What is claimed is:

1. A cable management device for supporting and managing cables, the cable management device comprising:
   a connecting assembly;
   a sliding rail assembly comprising a first sliding rail and a second sliding rail, the first sliding rail and the second sliding rail being parallel to each other; the first sliding rail comprising a first outer rail, a first middle rail, and a first inner rail, the first middle rail being slidably arranged on the first outer rail, and the first inner rail being slidably arranged on the first middle rail; the second sliding rail comprising a second outer rail, a second middle rail, and a second inner rail, the second middle rail being slidably arranged on the second outer rail, and the second inner rail being slidably arranged on the second middle rail; and
   a cable management assembly comprising a first sliding arm, a second sliding arm, a third sliding arm, a fourth sliding arm, and a supporting bar; the first sliding arm, the second sliding arm, the third sliding arm, and the fourth sliding arm being pivotally connected in that order for accommodating the cables; the supporting bar being rotatably connected to a pivot joint of the second sliding arm and the third sliding arm; the first sliding arm being movably connected to the second outer rail through the connecting assembly, the fourth sliding arm being movably connected to the first inner rail through the connecting assembly; one end of the supporting bar being connected to the first middle rail through the connecting assembly, and another end being connected to the second middle rail through the connecting assembly; the supporting bar comprises a first sliding member and a second sliding member slidably arranged on the first sliding member; one end of the first sliding member is movably mounted on the second middle rail through the connecting assembly, and another end of the first sliding member is slidably sleeved on the second sliding member along a length direction of the supporting bar; one end of the second sliding member away from the first sliding member is movably mounted on the first middle rail through the connecting assembly; and the first sliding member defines a clamping part protruding from a surface of the first sliding member facing the second sliding member, the second sliding member defines a groove, the clamping part is configured to cooperate with the groove to restrict a movement of the second sliding member in the length direction.

2. The cable management device of claim 1, wherein the second sliding member defines a groove configured for accommodating the clamping part.

3. The cable management device of claim 1, wherein the second sliding arm defines a first bent portion, and the first bent portion is disposed towards the fourth sliding arm to limit a movement of the supporting bar.

4. The cable management device of claim 3, wherein the second sliding arm further defines at least one first protrusion, the first sliding member further defines a pivot hole, and the at least one first protrusion cooperates with the pivot hole.

5. The cable management device of claim 4, wherein the at least one first protrusion comprises two first protrusions, the two first protrusions cooperatively form a circle, and the pivot hole is square.

6. The cable management device of claim 5, wherein a side length of the pivot hole is greater than a maximum diameter of the circle.

7. The cable management device of claim 3, wherein the third sliding arm defines a second bent portion, and the second bent portion is disposed towards the first sliding arm to limit a movement of the supporting bar.

8. The cable management device of claim 7, wherein each of the first bent portion and the second bent portion is L-shaped.

9. The cable management device of claim 1, wherein the cable management assembly further comprises a fitting piece, the fitting piece penetrates through the second sliding arm, the third sliding arm, and a pivot hole of the first sliding member, and the fitting piece is arranged at the pivot joint between the second sliding arm and the third sliding arm.

10. The cable management device of claim 1, wherein the connecting assembly comprises a first connecting member and a second connecting member, one end of the first connecting member is connected to the second outer rail, and another end is pivotally connected to the first sliding arm, so that one end of the first sliding arm away from the second sliding arm is configured to rotate relative to the first connecting member.

11. The cable management device of claim 10, wherein one end of the second connecting member is connected to the first sliding member, and another end is connected to the second middle rail, so that the second middle rail is configured to drive the first sliding member to move when the second middle rail slides.

12. The cable management device of claim 10, wherein the connecting assembly further comprises a third connecting member and a fourth connecting member, one end of the third connecting piece is connected to the second sliding member, and another end is connected to the first middle rail, so that the first middle rail is configured to drive the second sliding member to move when the first middle rail slides.

13. The cable management device of claim 12, wherein one end of the fourth connecting member is connected to the first inner rail, and another end is pivotally connected to the fourth sliding arm, so that one end of the fourth sliding arm away from the third sliding arm is configured to rotate relative to the fourth connecting member, and the first inner rail is configured to drive the fourth sliding arm to move when the first inner rail slides.

14. The cable management device of claim 1, wherein the first sliding arm comprises a first end portion and a second end portion opposite to the first end portion, and the second sliding arm comprises a third end portion and a fourth end portion opposite to the third end portion.

15. The cable management device of claim 14, wherein the first end portion is pivotally connected to the second outer rail through the connecting assembly, and the second end portion and the third end portion of the second sliding arm are pivotally connected to each other.

16. The cable management device of claim 15, wherein the third sliding arm comprises a fifth end portion and a sixth end portion opposite to the fifth end portion, and the fourth sliding arm comprises a seventh end portion and an eighth end portion opposite to the seventh end portion; the fifth end portion is pivotally connected to the fourth end portion of the second sliding arm, and the sixth end portion is pivotally connected to the seventh end portion.

17. The cable management device of claim 16, wherein the eighth end portion is movably connected to the first inner rail through the connecting assembly.

18. A server chassis comprising:
- a cabinet;
- a carrier board mounted in the cabinet and configured for placing a server; and
- a cable management device, the cable management device comprising:
  - a connecting assembly;
  - a sliding rail assembly comprising a first sliding rail and a second sliding rail, the first sliding rail and the second sliding rail being parallel to each other; the first sliding rail comprising a first outer rail, a first middle rail, and a first inner rail, the first middle rail being slidably arranged on the first outer rail, and the first inner rail being slidably arranged on the first middle rail; the second sliding rail comprising a second outer rail, a second middle rail, and a second inner rail, the second middle rail being slidably arranged on the second outer rail, and the second inner rail being slidably arranged on the second middle rail; and
  - a cable management assembly comprising a first sliding arm, a second sliding arm, a third sliding arm, a fourth sliding arm, and a supporting bar; the first sliding arm, the second sliding arm, the third sliding arm, and the fourth sliding arm being pivotally connected in that order for accommodating cables; the supporting bar being rotatably connected to a pivot joint of the second sliding arm and the third sliding arm; the first sliding arm being movably connected to the second outer rail through the connecting assembly, the fourth sliding arm being movably connected to the first inner rail through the connecting assembly; one end of the supporting bar being connected to the first middle rail through the connecting assembly, and another end being connected to the second middle rail through the connecting assembly;

wherein the sliding rail assembly of the cable management device is installed on the cabinet, the cables of the server can be accommodated in the first sliding arm, the second sliding arm, the third sliding arm, and the fourth sliding arm of the cable management device, and the carrier board is slidably connected to the sliding rail assembly of the cable management device; the supporting bar comprises a first sliding member and a second sliding member slidably arranged on the first sliding member; one end of the first sliding member is movably mounted on the second middle rail through the connecting assembly, and another end of the first sliding member is slidably sleeved on the second sliding member along a length direction of the supporting bar; one end of the second sliding member away from the first sliding member is movably mounted on the first middle rail through the connecting assembly; and the first sliding member defines a clamping part protruding from a surface of the first sliding member facing the second sliding member, the second sliding member defines a groove, the clamping part is configured to cooperate with the groove to restrict a movement of the second sliding member in the length direction.

\* \* \* \* \*